United States Patent
Gieskes

(10) Patent No.: US 7,428,326 B1
(45) Date of Patent: Sep. 23, 2008

(54) METHOD FOR IMPROVING RELIABILITY IN A COMPONENT PLACEMENT MACHINE BY VACUUM NOZZLE INSPECTION

(75) Inventor: Koenraad Gieskes, Deposit, NY (US)

(73) Assignee: Universal Instruments Corporation, Binghamton, NY (US)

( * ) Notice: Subject to any disclaimer, the term of this patent is extended or adjusted under 35 U.S.C. 154(b) by 909 days.

(21) Appl. No.: 10/307,848

(22) Filed: Dec. 2, 2002

Related U.S. Application Data

(60) Provisional application No. 60/338,820, filed on Nov. 30, 2001.

(51) Int. Cl.
*G06K 9/00* (2006.01)

(52) U.S. Cl. .................. 382/141; 382/145; 382/147; 382/152

(58) Field of Classification Search ............. 382/141, 382/145, 147, 152
See application file for complete search history.

(56) References Cited

U.S. PATENT DOCUMENTS

| | | | | |
|---|---|---|---|---|
| 5,956,134 | A * | 9/1999 | Roy et al. ............ | 356/237.5 |
| 6,201,567 | B1 * | 3/2001 | Kuroda ................ | 348/86 |
| 6,640,431 | B1 * | 11/2003 | Yoriki et al. .......... | 29/834 |
| 6,738,504 | B1 * | 5/2004 | Higashi et al. ........ | 382/146 |
| 6,748,104 | B1 * | 6/2004 | Bachelder et al. ..... | 382/151 |
| 2005/0102826 | A1 | 5/2005 | Asai et al. | |

FOREIGN PATENT DOCUMENTS

| | | | |
|---|---|---|---|
| EP | 1542524 A1 | | 6/2005 |
| WO | WO91/13535 | * | 9/1991 |
| WO | WO2004016064 | | 2/2004 |

* cited by examiner

*Primary Examiner*—Bhavesh M Mehta
*Assistant Examiner*—Jonathan Schaffer
(74) *Attorney, Agent, or Firm*—Schmeiser, Olsen & Watts

(57) ABSTRACT

The present invention features a method whereby each vacuum nozzle in a multi-spindle component placement machine is inspected placement cycle. This process also allows for updating calibration of the nozzle position as well as immediate feedback regarding the condition of the vacuum nozzle. A chipped orifice or otherwise damaged nozzle is detected using a vision system and comparing the currently acquired image of each nozzle with the image of an "ideal" nozzle. Likewise, contamination such as adhesive on the nozzle is detected before that contamination can affect placement accuracy. Because of the nozzle inspection during the placement cycle, there is no slowdown of the placement machine cycle rate.

5 Claims, 4 Drawing Sheets

METHOD FOR IMPROVING RELIABILITY IN A COMPONENT PLACEMENT MACHINE BY VACUUM NOZZLE INSPECTION

RELATED APPLICATIONS

This application claims priority to U.S. Provisional Patent Application Ser. No. 60/338,820, filed Nov. 30, 2001.

FIELD OF THE INVENTION

This invention relates to component placement machines and, more particularly to a method for inspecting vacuum nozzles to ensure accurate and reliable component placement.

BACKGROUND OF INVENTION

The use of sophisticated placement machines in manufacturing printed circuit or similar cards, boards, panels, etc. is well known. The term printed circuit board (PCB) is used herein is to refer to any such electronic packaging structure. Typically, reels of tape-mounted circuit components are supplied to the placement machine by multiple feeders, each feeder holding a reel of components. Components are provided at a pick station by each feeder assembly. A pick/place head, having a vacuum spindle equipped with a vacuum nozzle, may be moved in the Z-axis as well as along the X and Y axes. The vacuum nozzle is sized and otherwise configured for use with each different size and style of component to be placed by the machine. In operation, the pick/place head is moved to the pick station and the nozzle positioned over the tape-mounted component. The vacuum nozzle is lowered to a point where, upon application of vacuum, the component is removed from its backing tape, centered, and held tightly against the nozzle orifice. The pick/place head is then moved to a point over the printed circuit board being assembled and the component deposited on the printed circuit board at a predetermined location.

Several problems must be addressed in this seemingly simple operation. First, as component sizes have shrunk, the accuracy of placement of the vacuum nozzle over the component for picking has become more critical. Typically, calibration routines are performed upon machine setup or periodically as required for operation of the machine. With microminiature components, small variations occurring over time can quickly lead to inaccurate picking and/or placement of these components.

Vacuum nozzles have also shrunk commensurately to maintain compatibility with these shrinking component sizes. Consequently, the vacuum nozzles have become more fragile and more readily damaged. Damage may occur while a nozzle is being installed on a pick/place head or during the actual pick/place operation of the component placement machine.

A third problem is that the adhesive typically used to hold surface mount and similar components in place until a solder reflow operation may contaminate the nozzle. Likewise, small particles of dirt or debris may lodge in the nozzle. As nozzle orifice sizes have shrunk, the effects of these contaminants have become more critical to reliable operation of the placement machine.

Currently, component placement machines utilize multi-spindle pick/place heads to improve assembly speed. Each head contains multiple vacuum spindles, each having its own vacuum nozzle. With multi-spindle machines, the need for real-time monitoring of the vacuum nozzle condition becomes even more critical. One damaged or contaminated nozzle can be difficult to locate based on intermittent placement problems on the printed circuit boards being assembled.

SUMMARY OF THE INVENTION

The present invention is a method whereby each vacuum nozzle is inspected during each component placement cycle. This process also allows for updating calibration of the nozzle position as well as immediate feedback regarding the condition of the vacuum nozzle. A chipped orifice or otherwise damaged nozzle is detected using a vision system and comparing the currently acquired image of each nozzle with the image of an "ideal" nozzle. Likewise, contamination such as adhesive on the nozzle is detected before that contamination can affect placement accuracy. Adhesive on the nozzle can cause a component to stick to the nozzle when the component should be placed on the printed circuit board. When the inspection process is applied to a multi-spindle head, each nozzle can be inspected during each component placement cycle. Therefore the inspection process in multi-spindle heads allows no slowdown of the placement machine cycle rate for this process to occur.

BRIEF DESCRIPTION OF THE DRAWINGS

A complete understanding of the present invention may be obtained by reference to the accompanying drawings, when taken in conjunction with the detail description thereof and in which.

DESCRIPTION OF THE PREFERRED EMBODIMENT

The present invention pertains to inspection of vacuum nozzles on the multi-spindle pick/place head of a component placement machine for assembling printed circuit boards.

Figure 1:
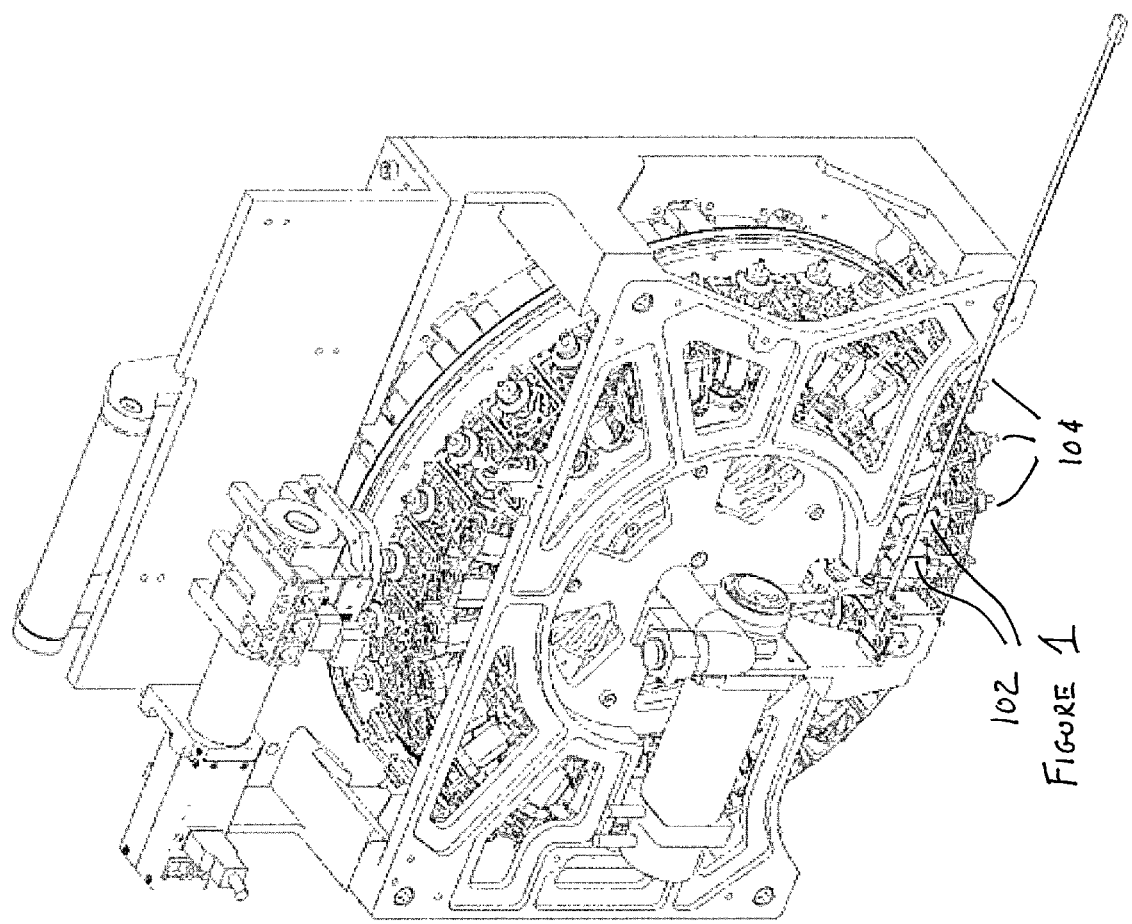
FIG. 1 is a side, schematic view of a multi-spindle pick/place head showing a plurality of vacuum spindles disposed thereupon.

Referring first to FIG. 1, there is shown a schematic view of a multi-spindle, rotatable pick/place head, generally at reference number 100. A plurality of vacuum spindles 102 is disposed on head 100. It will be recognized by those skilled in the component placement machine arts that a head 100 may carry any number of vacuum spindles 102 disposed radially about its perimeter. For purposes of this disclosure, a general case of n vacuum spindles 102 is discussed. A vacuum nozzle or chuck 104 is disposed at the end of each vacuum spindle 102. Multi-spindle pick/place heads 100 are known and the concept forms no part of the present invention and are described in U.S. Pat. No. RE. 35,027 and German Patent No. EP 0 315 799.

Figure 2:
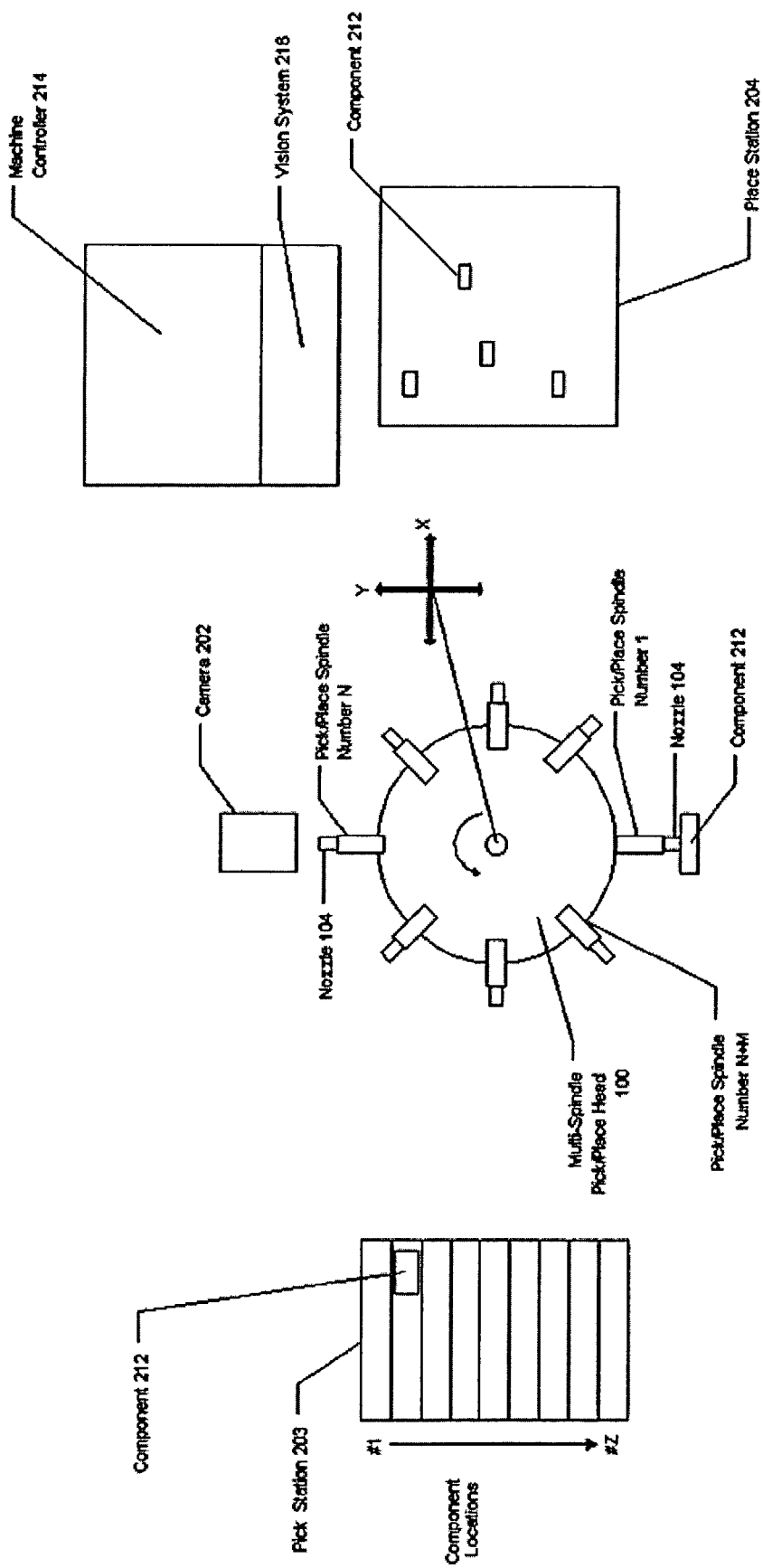
FIG. 2 is a simplified schematic block diagram of a portion of a component placement machine adapted to practice the method of the invention.

It is also known to use a vision system as a process station, as described in U.S. Pat. No. RE. 35,027, in component placement machines to process images of components to facilitate identifying, positioning and manipulating or orienting the components held against a vacuum nozzle 104 of a vacuum spindle 102. FIG. 2 shows a schematic block diagram 200 of a typical image acquisition arrangement for use in a component placement machine. At least one camera 202 is used to capture images, often at different magnifications or with different lighting conditions. A pick station 203 and a place stations 204 are shown.

The output of camera 202 is connected to electronic signal processing and control circuitry 214. Circuitry 214 controls camera 202 and provides image capture functions. The output of electronic signal processing and control circuitry 214 is connected to a vision system 216. The present invention expands the use of such vision systems 216 to perform nozzle inspection during each pick cycle or place cycle performed by each vacuum nozzle 104 of the component placement machine. The inventive method is operative with any number of vacuum spindles 102 and is not considered limited to any particular number thereof. It will also be recognized that the timing data used for purposes of disclosure may vary depending on the actual design of the pick head 100.

Reference images of good nozzles (not shown) are stored using methods not a part of the instant invention. At least one reference image is provided for each nozzle size and/or type in use on the component placement machine. These reference images are available to the vision system 216 in a suitable memory or library, so that image compare algorithms and technology may be used to compare the nozzle image captured during each pick or place cycle of machine operation with an appropriate reference image. Any significant deviation is immediately flagged and, depending upon the severity of the defect, the placement machine may be stopped. In alternate embodiments, a defective nozzle 104 on a head 100 could be logically disabled (i.e., removed from active service) without stopping the placement machine with the remaining good nozzles operating at a slightly reduced efficiency.

In the embodiment chosen for purposes of disclosure each active nozzle 104 on each spindle 102 of the head 100 is imaged during each pick or place cycle.

At inspection time, the exact position of the nozzle 104 may be recorded, thereby re-calibrating the position of the nozzle. The position calibration data is typically placed in a lookup table, so that the most recent position data may be utilized by the placement machine for the next pick or place cycle involving that particular nozzle. While methods other than lookup tables could be used for storing nozzle calibration information, a fixed table of nozzles associated with a position on the pick/place head 100 has been found to be satisfactory. In addition to verifying the exact, current nozzle position, the inventive method inspects the physical condition of each nozzle 104. In the embodiment chosen for purposes of disclosure, data from the same lookup table is used to set up and initiate each nozzle inspection. It will be recognized that other data storage formats could be used.

Figure 3:
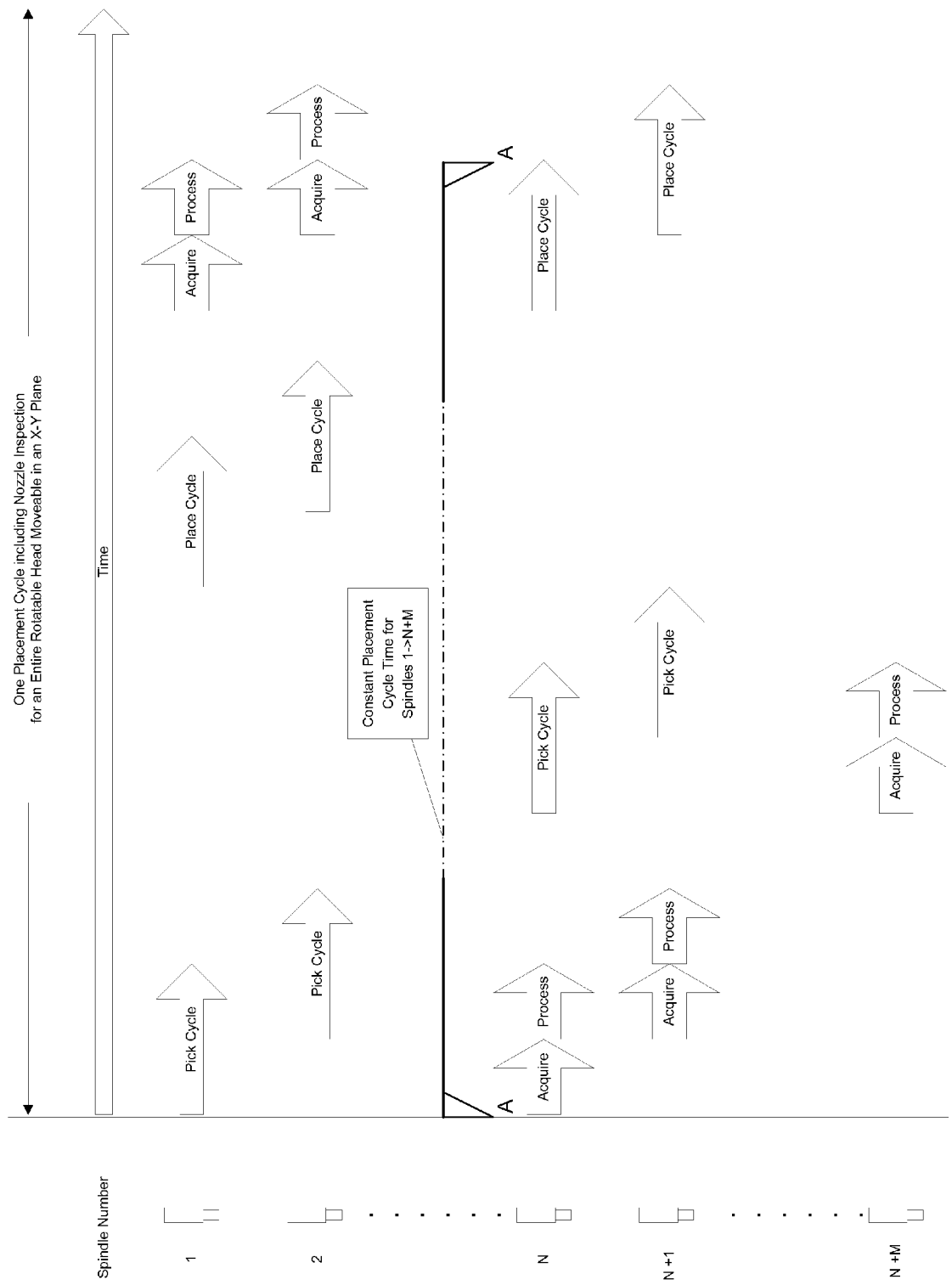
FIG. 3 is a timing diagram of nozzle image acquisition and processing during the placement cycle time.

Referring now to FIG. 3, there is shown a timing diagram for image acquisition and processing within a pick or place cycle. As may be seen, image acquisition and processing (inspection) for each spindle are always completed within a pick or place cycle.

Figure 4:
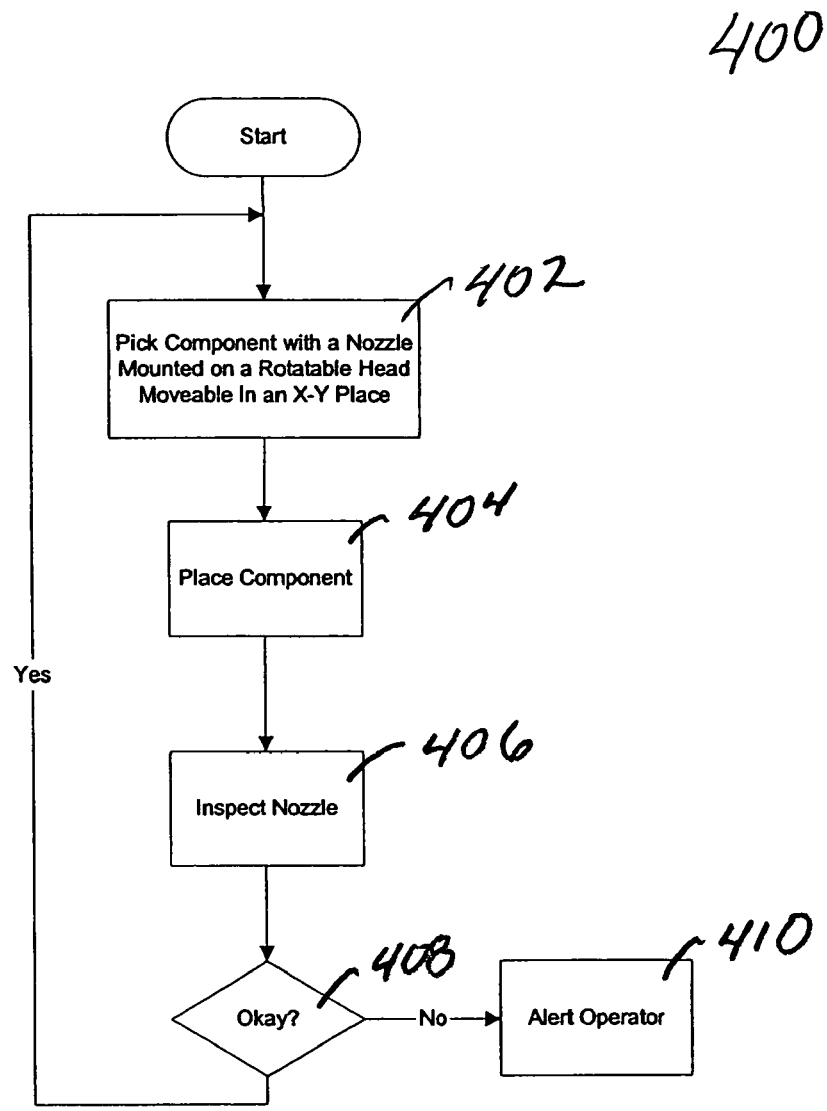
FIG. 4 is a simplified flow chart of the method of the invention.

Referring now to FIGS. 2 and 4, there is shown a flow chart 400 of the steps of the inventive method (FIG. 4). It is assumed that initial placement machine setup, nozzle installation and calibration have previously been performed. The pick/place head is moved to a pick station 203, a particular spindle is lowered and a component 212 is picked, step 402. This step is repeated for the number of spindles in the multi-spindle pick/place head. The pick/place head is then moved under program control to the desired X-Y coordinates over the printed circuit board being assembled at the place station 204. The spindle is lowered and the component 212, picked in step 402, is placed onto the printed circuit board, step 404.

After component placement begins, the empty nozzles 104 proceed to camera 202. As components 212 are continued to be placed or when the head 102 returns to the component pick station 203 and the previously inspected nozzles 104 begin to acquire new components 212, the remaining uninspected nozzles 104 move to camera 202 where they are inspected. Therefore, either during the placement cycle or the pick cycle all nozzles 104 are inspected at camera 202. This step is repeated for all components 212. Details of the nozzle inspection process, step 406, are provided in more detail hereinbelow.

Assuming that the inspection process, step 406, finds no nozzle integrity problem and no significant contamination at or near the nozzle orifice, step 408, the placement cycle continues, step 402. If, however, a problem with nozzle integrity or contamination is discovered, step 408, the operator is alerted, step 410. In addition, depending upon the severity of the problem, the component placement machine could be stopped automatically or the problem spindle removed from active service until the problem is resolved.

After image acquisition is complete, the image or images are processed, step 406. Processing involves comparing the newly-acquired image(s) with stored ideal images of the nozzle being inspected and using vision algorithms to infer whether any image differences constitute either a nozzle integrity or a nozzle contamination problem.

It will be recognized that an inspection of a particular vacuum nozzle 104 associated with a particular vacuum spindle 102 need not be performed. If a nozzle 104 is not currently in active service, for example, inspection is skipped. It would also be possible to define algorithms for periodically skipping inspection of a nozzle 104 if placement machine speed placed an undue burden on the vision system, particularly image processing. The invention, therefore, is not considered limited to a method wherein each nozzle is inspected during each placement cycle.

Having thus described the invention, what is desired to be protected by Letters Patent is presented in the subsequently appended claims.

What is claimed is:

1. A method for ensuring vacuum nozzle condition in a component placement machine, the steps comprising:
   a) providing a pick/place component placement machine comprising a plurality of vacuum nozzles mounted on a head, said head being rotatable about an axis thereof and adapted for movement along an X and a Y axis above a printed circuit board, each of said plurality of vacuum nozzles being adapted to perform at least one of the operations picking, holding, orienting, transporting, and placing a component on said printed circuit board;
   b) providing a vision system adapted to facilitate at least one of said picking, holding, orienting, transporting and placing operations of said component;
   c) picking said component from a supply of components using said at least one of said plurality of vacuum nozzles;
   d) placing said picked component onto a printed circuit board at a predetermined location; and
   e) inspecting said at least one of said plurality of vacuum nozzles using said vision system, wherein said vision system comprises at least one camera, said camera being configured to capture an image of said at least one of said plurality of vacuum nozzles and configured to capture an image of said component, and further wherein said inspecting at least one of said plurality of vacuum nozzles using said vision system is accomplished substantially completely during at least one of step (c) and (d).

2. The method for ensuring vacuum nozzle condition in a component placement machine as recited in claim 1, wherein said inspection step (e) comprises comparing an image of one of said plurality of vacuum nozzles to a stored reference image of a known good nozzle.

3. The method for ensuring vacuum nozzle condition in a component placement machine as recited in claim 1, wherein said inspection step (e) further comprises examining one of said plurality of vacuum nozzles to detect at least one of the conditions: correct vacuum nozzle type, vacuum nozzle damage, and contamination proximate an orifice of said vacuum nozzle.

4. The method for ensuring vacuum nozzle condition in a component placement machine as recited in claim 1, wherein said component placement machine further comprises stored data representative of at least one parameter related to at least one of said plurality of vacuum nozzles.

5. The method for ensuring vacuum nozzle condition in a component placement machine as recited in claim 1, wherein said inspecting step (e) comprises the sub-steps:

i) acquiring at least one image of at least one of said plurality of vacuum nozzles, and ii) processing said at least one image.

* * * * *